(12) United States Patent
Inagaki et al.

(10) Patent No.: US 8,339,018 B2
(45) Date of Patent: Dec. 25, 2012

(54) LAMINATED PIEZOELECTRIC ELEMENT, EJECTION DEVICE, FUEL EJECTION SYSTEM, AND METHOD FOR MANUFACTURING LAMINATED PIEZOELECTRIC ELEMENT

(75) Inventors: Masahiro Inagaki, Kirishima (JP); Takeshi Okamura, Kirishima (JP); Tomohiro Kawamoto, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 549 days.

(21) Appl. No.: 12/602,076

(22) PCT Filed: May 29, 2008

(86) PCT No.: PCT/JP2008/059903
§ 371 (c)(1),
(2), (4) Date: Jan. 19, 2010

(87) PCT Pub. No.: WO2008/146878
PCT Pub. Date: Dec. 4, 2008

(65) Prior Publication Data
US 2010/0154747 A1    Jun. 24, 2010

(30) Foreign Application Priority Data

May 30, 2007    (JP) .................................. 2007-143958

(51) Int. Cl.
*H01L 41/083* (2006.01)
(52) U.S. Cl. ....................................... 310/366; 310/328
(58) Field of Classification Search ................. 310/328, 310/366
See application file for complete search history.

(56) References Cited

U.S. PATENT DOCUMENTS

| | | | |
|---|---|---|---|
| 5,406,164 A * | 4/1995 | Okawa et al. ................. | 310/366 |
| 6,734,607 B2 | 5/2004 | Nagaya et al. | |
| 7,208,862 B2 * | 4/2007 | Florian et al. ................. | 310/366 |
| 2004/0178701 A1 * | 9/2004 | Sato et al. ..................... | 310/328 |
| 2005/0206274 A1 | 9/2005 | Kobane et al. | |
| 2009/0220765 A1 * | 9/2009 | Okamura et al. .......... | 428/316.6 |

FOREIGN PATENT DOCUMENTS

| | | |
|---|---|---|
| JP | 63-288074 | 11/1988 |
| JP | 03-270944 A | 12/1991 |
| JP | 7-30165 | 1/1995 |
| JP | 2001-063041 | 3/2001 |
| JP | 2002-261344 | 9/2002 |
| JP | 2004-207633 | 7/2004 |
| JP | 2005-005680 | 1/2005 |
| JP | 2005-235863 | 9/2005 |
| JP | 2006-269982 | 10/2006 |

* cited by examiner

*Primary Examiner* — Thomas Dougherty
(74) *Attorney, Agent, or Firm* — Procopio, Cory, Hargreaves & Savitch LLP

(57) ABSTRACT

Provided is a highly durable laminated piezoelectric element wherein a stress generated at a portion, i.e., the boundary between an active region and inactive region, is reduced. A method for manufacturing such laminated piezoelectric element is also provided. The laminated piezoelectric element has a laminated structure (15) wherein a plurality of piezoelectric layers (11) and internal electrode layers (13) are alternately laminated. The piezoelectric layer (11) contains a metal element other than those elements constituting piezoelectric ceramic, i.e., the main component of the piezoelectric layer (11), and at a portion (11a) of the piezoelectric layer (11) at the vicinity of an end of the internal electrode layer (13), metal particles having a metal element as a main component exist. The content of the metal at the portion (11a) at the vicinity of the end is higher than the content of a compound of the metal element and a nonmetal element.

18 Claims, 7 Drawing Sheets

LAMINATED PIEZOELECTRIC ELEMENT, EJECTION DEVICE, FUEL EJECTION SYSTEM, AND METHOD FOR MANUFACTURING LAMINATED PIEZOELECTRIC ELEMENT

RELATED APPLICATION

The present application is the U.S. national stage application of PCT/2008/059903 filed 29 May 2008, which claims the benefit of Japanese patent application serial number JP2007-143958, filed 30 May 2007, each of which is incorporated herein by reference in its entirety.

FIELD OF THE INVENTION

The present invention relates to a laminated piezoelectric element, an ejection device, a fuel ejection system, and a method for manufacturing a laminated piezoelectric element.

BACKGROUND

Heretofore, a laminated piezoelectric element (hereinafter referred to as "element" in some cases) has been known which includes a laminate structure in which piezoelectric layers are laminated to each other with internal electrode layers interposed therebetween, and a pair of external electrodes formed on side surfaces of the laminate structure. In general, the laminated piezoelectric element has a structure in which a positive external electrode and a negative external electrode are formed on side surfaces facing each other and in which internal electrode layers are alternately electrically connected to the respective external electrodes. In order to connect the internal electrode layers to the respective external electrodes, one end portion of each of the internal electrode layers is partly exposed at one side surface of the laminate structure, and the other end portion is buried between respective adjacent piezoelectric layers. That is, the internal electrode layers are not formed over the entire primary surfaces of the piezoelectric layers, and there are regions in which the internal electrode layers are not formed (for example, see Japanese Patent Application Publication No. H7-30165 and Japanese Patent Application Publication No. 2001-63041).

SUMMARY

In a laminated piezoelectric element as described above, an electric field is liable to be concentrated on a piezoelectric layer located in the vicinity of an end portion of an internal electrode. In addition, although a region (active region) in which internal electrodes connected to different polar electrodes are overlapped with each other in a lamination direction is displaced when an electric field is applied, a region (inactive region) in which the above internal electrodes are not overlapped with each other in the lamination direction is not displaced since an electric field is not applied, and hence a stress is liable to be concentrated in the vicinity of a boundary between the active region and the inactive region.

Accordingly, a first object of the present invention is to provide a highly durable laminated piezoelectric element which can reduce a stress generated in a region corresponding to the boundary between an active region and an inactive region and a method for manufacturing the above laminated piezoelectric element. In addition, a second object of the present invention is to provide a highly durable ejection device and fuel ejection system, each using the laminated piezoelectric element of the present invention.

A first laminated piezoelectric element of the present invention is a laminated piezoelectric element comprising a laminate structure in which piezoelectric layers and internal electrode layers are alternately laminated to each other, and regions of the piezoelectric layers in the vicinities of end portions of the internal electrode layers each contain one or more metal phases.

A second laminated piezoelectric element of the present invention is a laminated piezoelectric element comprising a laminate structure in which piezoelectric layers and internal electrode layers are alternately laminated to each other. The piezoelectric layers comprise a metal element, and in each of regions of the piezoelectric layers in the vicinities of end portions of the internal electrode layers, the content of one or more metal phases comprising the metal element as a main component is higher than the content of one or more metal phases comprising the metal element as a main component in each of regions other than the regions in the vicinities of the end portions.

A third laminated piezoelectric element of the present invention is a laminated piezoelectric element comprising a laminate structure in which piezoelectric layers and internal electrode layers are alternately laminated to each other. The piezoelectric layers comprise a metal element, and in each of regions of the piezoelectric layers in the vicinities of end portions of the internal electrode layers, the number of bonds between the metal elements is larger than the number of bonds between the metal element and oxygen.

A fourth laminated piezoelectric element of the present invention is a laminated piezoelectric element comprising a laminate structure in which piezoelectric layers and internal electrode layers are alternately laminated to each other. The piezoelectric layers comprise a metal element, and when the piezoelectric layers are analyzed by an x-ray photoelectron spectroscopy in which the intensity of a peak indicating a bond between the metal elements is represented by E1 and the intensity of a peak indicating a bond between the metal element and a non-metal element is represented by E2, E1 is higher than E2 in each of regions of the piezoelectric layers in the vicinities of end portions of the internal electrode layers.

An ejection device of the present invention comprises a container which comprises an ejection hole; and one of the above-described laminated piezoelectric elements and is configured to eject a liquid filled in the container through the ejection hole by a drive of the laminated piezoelectric element.

A fuel ejection system of the present invention comprises a common rail which stores a high-pressure fuel; the above-described ejection device which ejects the high-pressure fuel stored in the common rail; a pressure pump which supplies the high-pressure fuel to the common rail; and an ejection control unit which supplies a drive signal to the ejection device.

A method for manufacturing a laminated piezoelectric element of the present invention comprises polarizing a laminated piezoelectric element, which comprises a laminate structure in which piezoelectric layers and internal electrode layers are alternately laminated to each other, in a reducing atmosphere or a vacuum atmosphere.

In the first laminated piezoelectric element of the present invention, the regions of the piezoelectric layers in the vicinities of the end portions of the internal electrode layers each comprise a metal element. Accordingly, the following advantages can be obtained. Since the regions of the piezoelectric layers in the vicinities of the end portions of the internal electrode layers are each located at a boundary between an active region and an inactive region of the element, an electric field is liable to be concentrated on the regions in the vicinities of the end portions as described above; however, when one or more metal phases are made present in the regions in the vicinities of the end portions, the electric field strength in each of the regions of the piezoelectric layers in the vicinities of the end portions can be decreased. Accordingly, since an amount of displacement of each of the regions in the vicinities of the end portions which is located at the boundary between an active region and an inactive region can be decreased, and hence a stress generated in the this region can be reduced.

The second laminated piezoelectric element of the present invention is a laminated piezoelectric element comprising a laminate structure in which piezoelectric layers and internal electrode layers are alternately laminated to each other, the piezoelectric layers comprise a metal element, and in each of regions of the piezoelectric layers in the vicinities of end portions of the internal electrode layers, the content of one or more metal phases comprising the metal element as a main component is higher than the content of one or more metal phases comprising the metal element as a main component in each of regions other than the regions in the vicinities of the end portions; hence, the strength of the electric field in each of the regions in the vicinities of the end portions can be decreased. Accordingly, since an amount of displacement of each of the regions in the vicinities of the end portions which is located at the boundary between an active region and an inactive region can be decreased, a stress generated in the above regions can be reduced.

The third laminated piezoelectric element of the present invention is a laminated piezoelectric element comprising a laminate structure in which piezoelectric layers and internal electrode layers are alternately laminated to each other, the piezoelectric layers comprise a metal element, and in each of regions of the piezoelectric layers in the vicinities of end portions of the internal electrode layers, the number of bonds between the metal elements is larger than the number of bonds between the metal element and oxygen. Accordingly, the same effect as described above can be obtained.

A fourth laminated piezoelectric element of the present invention is a laminated piezoelectric element comprising a laminate structure in which piezoelectric layers and internal electrode layers are alternately laminated to each other, the piezoelectric layers comprise a metal element, and when the piezoelectric layers are analyzed by an x-ray photoelectron spectroscopy in which the intensity of a peak indicating a bond between the metal elements is represented by E1 and the intensity of a peak indicating a bond between the metal element and a non-metal element is represented by E2, E1 is higher than E2 in each of regions of the piezoelectric layers in the vicinities of end portions of the internal electrode layers. Accordingly, the same effect as described above can be obtained.

An ejection device of the present invention comprises a container which includes an ejection hole; and the laminated piezoelectric element according to the above embodiment, and is configured that a liquid filled in the container is ejected through the ejection hole by a drive of the laminated piezoelectric element. Accordingly, since a highly reliable laminated piezoelectric element having a long life is used in which a stress generated in driving is reduced, a highly reliable ejection device having a long life can be obtained.

A fuel ejection system of the present invention comprises a common rail which stores a high-pressure fuel; the ejection device according to the above embodiment which ejects the high-pressure fuel stored in the common rail; a pressure pump which supplies the high-pressure fuel to the common rail; and an ejection control unit which supplies a drive signal to the ejection device. Accordingly, since a highly reliable ejection device having a long life is used, a highly reliable fuel ejection system having a long life can be obtained.

Figure 1:
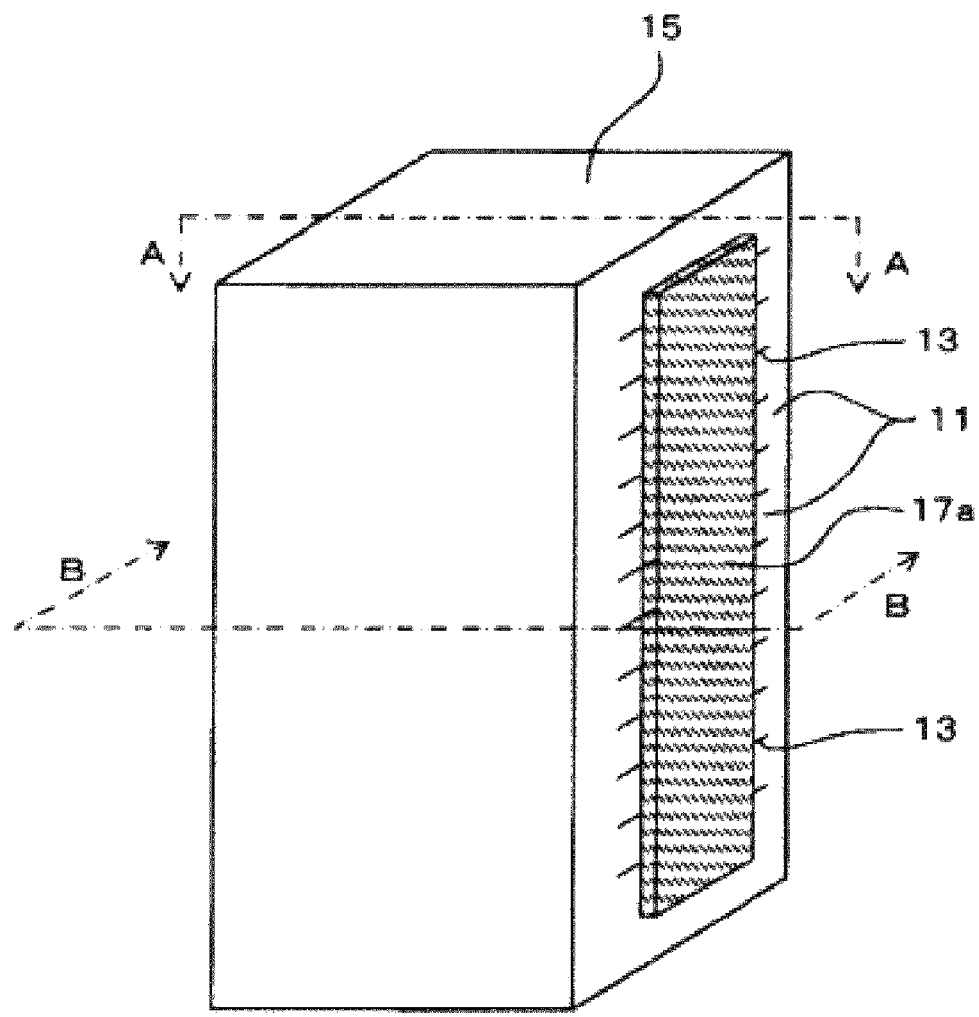
FIG. 1 is a perspective view illustrating a laminated piezoelectric element according to an embodiment of the present invention.

| Reference Numerals | |
|---|---|
| 11 | piezoelectric layer |
| 11a | region in the vicinity of end portion |
| 11b | region other than the region in the vicinity of end portion |
| 13 | internal electrode layer |
| 13a | end portion of internal electrode layer |
| 17a | negative external electrode |
| 17b | positive external electrode |
| 21 | metal phase |

DETAILED DESCRIPTION

<Laminated Piezoelectric Element>

Figure 2A:
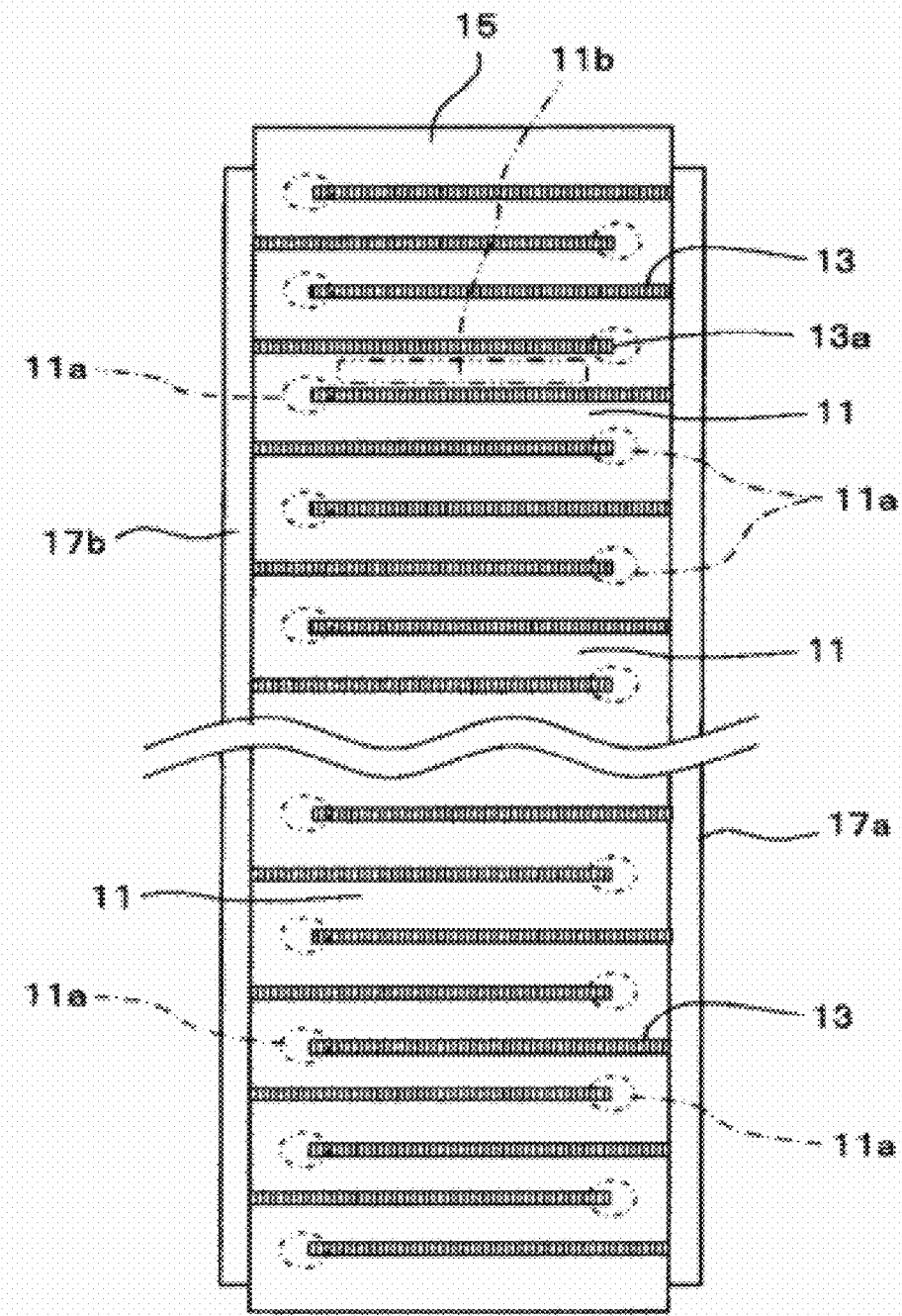
FIG. 2A is a cross-sectional view taken along the line A-A of the laminated piezoelectric element shown in FIG. 1.
Figure 2B:
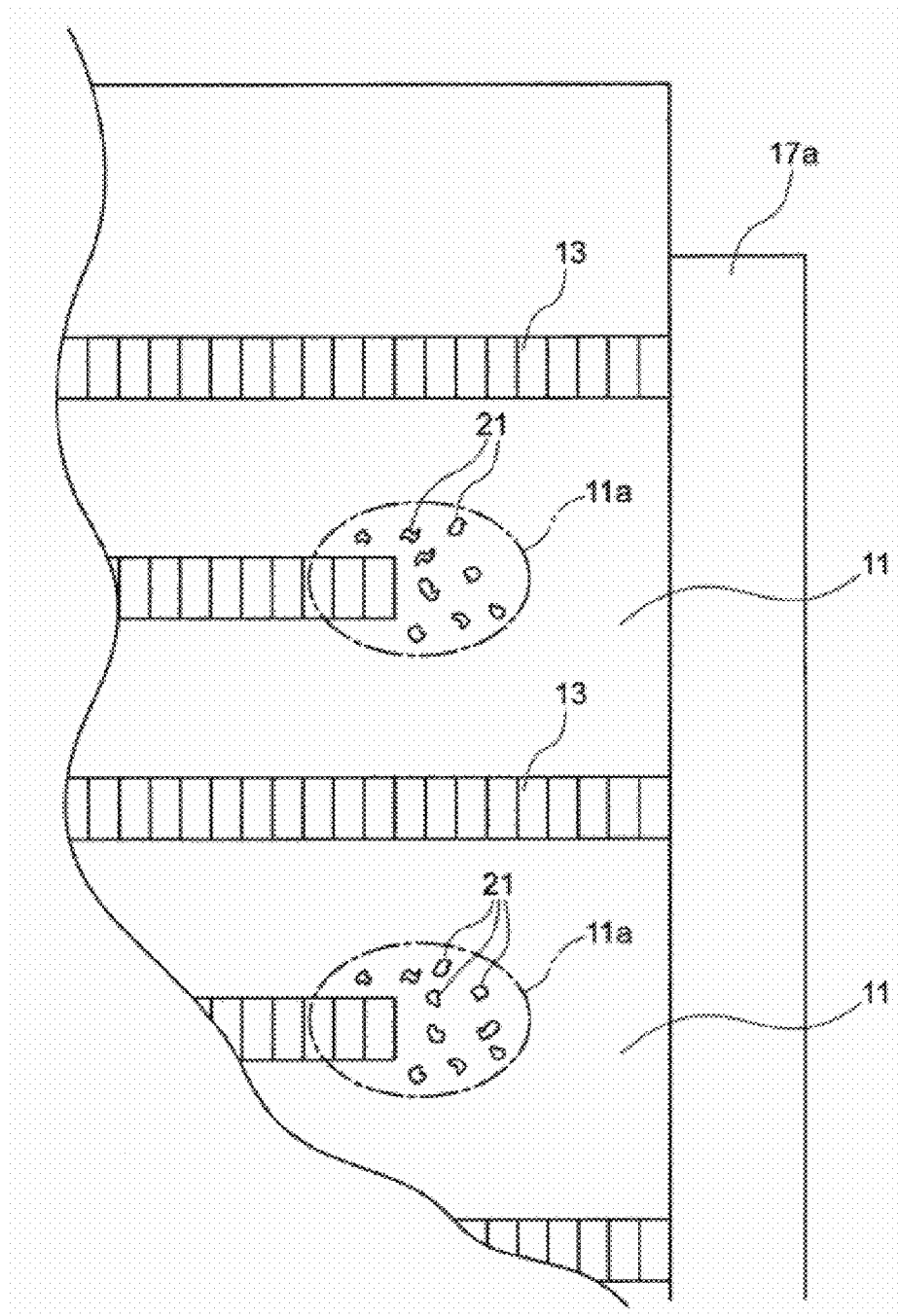
FIG. 2B is a partly enlarged cross-sectional view of FIG. 2A.
Figure 3:
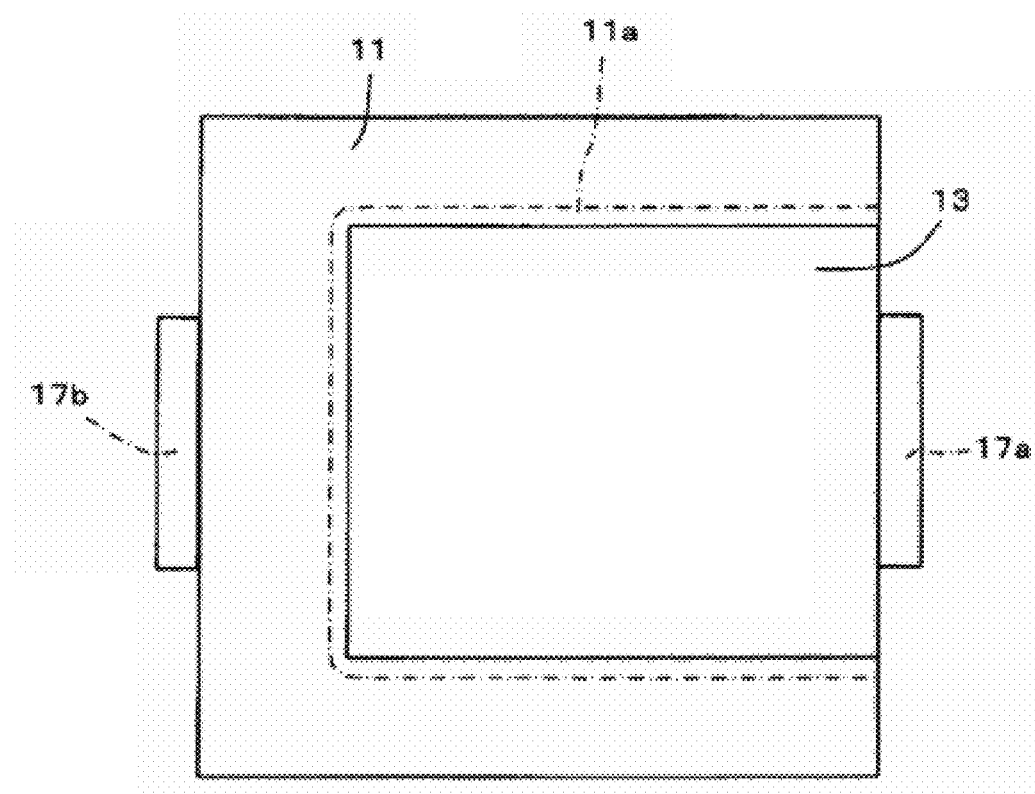
FIG. 3 is a cross-sectional view taken along the line B-B of the laminated piezoelectric element shown in FIG. 1.

Hereinafter, a laminated piezoelectric element according to an embodiment of the present invention will be described in detail with reference to the drawings. FIG. 1 is a perspective view illustrating a laminated piezoelectric element according to this embodiment, FIG. 2 is a cross-sectional view taken along the line A-A of the laminated piezoelectric element shown in FIG. 1, and FIG. 3 is a cross-sectional view taken along the line B-B of the laminated piezoelectric element shown in FIG. 1. This laminated piezoelectric element has a laminate structure 15 in which piezoelectric layers 11 and internal electrode layers 13 are alternately laminated to each other. A pair of external electrodes 17 (negative external electrode 17a and positive external electrode 17b) is formed on side surfaces of the laminate structure 15.

In a first embodiment, each piezoelectric layer 11 contains one or more metal phases 21 in a region 11a in the vicinity of an end portion of each internal metal layer 13. Accordingly, in a laminated piezoelectric element having a conventional structure, an electric field is concentrated on a piezoelectric layer present in a predetermined region from the end portion of the internal metal layer 13; however, in the laminated piezoelectric element according to the first embodiment, the electric field is dispersed by the one or more metal phases 21. Hence, in the laminated piezoelectric element according to the first embodiment, the electric field concentration on the region 11a of the piezoelectric layer in the vicinity of the end portion of the internal metal layer 13 can be reduced, and a stress generated in the vicinity of the boundary between an active region and an inactive region can be reduced when the laminated piezoelectric element is driven. In particular, the internal metal layer 13 and the one or more metal phases 21 are preferably insulated from each other, and in the case, the distribution of the electric field is further dispersed, so that the electric field concentration can be further reduced. In this embodiment, the one or more metal phases each indicate a phase in which metal elements are metal-bonded to each other to exhibit metal conductivity.

Furthermore, in the region 11a in the vicinity of the end portion of the internal metal layer 13, the content of the one or more metal phases 21 is preferably higher than the content of an oxide of a metal element forming the one or more metal phases 21. In this case, when the laminated piezoelectric element is driven, the electric field can be suppressed from being concentrated on the region 11a in the vicinity of the end portion of the internal metal layer 13, and in addition, a stress reducing effect is not varied by an ambient atmosphere in which the laminated piezoelectric element is disposed, so that a highly durable laminated piezoelectric element can be achieved.

Furthermore, in a region 11b of the piezoelectric layer 11 other than the region 11a in the vicinity of the end portion, the content of an oxide of the metal element forming the one or more metal phases 21 is preferably higher than the content of the one or more metal phases. As a result, since an electric-field dispersing effect can be generated in the boundary between an active layer and an inactive layer, the stress reducing effect can be more effectively generated.

Furthermore, when the piezoelectric layer 11 is primarily composed of a piezoelectric ceramic, and the one or more metal phases 21 are present in grain boundaries of the piezoelectric ceramic, an electric field dispersed during the drive can be dispersed among the grains of the piezoelectric ceramic. As a result, by using the characteristics of piezoelectric grains in which grain shapes are deformed by a stress, a piezoelectric substance itself can be used to reduce the stress, and hence the stress reducing effect can be further enhanced.

Furthermore, the one or more metal phases 21 are preferably dispersed in the region 11a in the vicinity of the end portion of the internal electrode layer 13. When the one or more metal phases 21 are dispersed in the region 11a, since the electric-field dispersing effect can be enhanced, the stress reducing effect can be improved, and in addition, since the one or more metal phases 21 are dispersed between the insulating piezoelectric layers 11 which are each an insulating material, the electric field is suppressed from being concentrated on a limited part of the piezoelectric layer 11. As a result, while the laminated piezoelectric element is driven, the piezoelectric layer is not unnecessarily heated by the electric field concentration, and the heat can be dissipated through the one or more metal phases 21.

The one or more metal phases 21 are preferably formed of a metal element other than an element forming a piezoelectric ceramic, and in this case, even when the laminated piezoelectric element is used under high-temperature and high-humidity conditions, ions are not conducted from the one or more metal phases 21 to the piezoelectric ceramic. As a result, the electric-field dispersing effect can be generated in a boundary portion between the active layer and the inactive layer, and hence the stress reducing effect can be maintained for a long period of time.

An example of the element of the one or more metal phases 21 present in the region 11a in the vicinity of the end portion may be an element having a high electrical conductivity, such as silver, copper, palladium, platinum, or nickel. Among those elements, silver is preferable since a higher stress reducing effect can be obtained because of its softness and low hardness. Hence, an example of an oxide of the metal element, for example, may be silver oxide or copper oxide. Silver oxide has a lower electrical conductivity than silver, and copper oxide has a lower electrical conductivity than copper.

In this embodiment, as shown in FIG. 2, the "region in the vicinity of the end portion" is preferably distributed to make an end portion 13a of the internal electrode layer 13 a center thereof and preferably has a thickness larger than the internal electrode layer 13 and smaller than the piezoelectric layer 11. The thickness in this embodiment indicates the length in a lamination direction of the element. Since the thickness of the region 11a in the vicinity of the end portion is larger than that of the internal electrode layer 13, the electric field strength in the region 11a in the vicinity of the end portion can be effectively decreased. On the other hand, since the thickness of the region 11a in the vicinity of the end portion is smaller than that of the piezoelectric layer 11, the insulating characteristics between adjacent internal electrode layers 13 can be suppressed from being degraded. In particular, according to a longitudinal cross-sectional view of FIG. 2, for example, the region 11a in the vicinity of the end portion is an approximately spherical region centered at the end of the internal electrode layer 13, and in a region in which the radius of the spherical region is approximately 10% to 95% of the thickness of the piezoelectric layer 11, grains are mainly distributed as the one or more metal phases 21. As for this distribution, the grains are preferably distributed at a high density in an area in which the electric field strength is expected to be high, and in particular, the grains are preferably distributed at a higher density in an area closer to the internal electrode layer 13.

In addition, although the width (length in a direction perpendicular to the lamination direction) of the region 11a in the vicinity of the end portion is not particularly limited, the distance between an end of the region 11a and the external electrode 17 is preferably ensured so as to maintain the insulation between the end portion 13a of the internal electrode layer 13 and the external electrode 17 formed on one of the side surfaces of the element. In order to effectively decrease the electric field strength in the region 11a in the vicinity of the end portion, the width of the region 11a in the vicinity of the end portion is preferably larger than the thickness of the internal electrode layer 13. In addition, in order to maintain particularly high insulating characteristics between the region 11a and the external electrode 17, the width of the region 11a in the vicinity of the end portion is preferably smaller than the thickness of the piezoelectric layer 11.

The thickness of the piezoelectric layer 11 is preferably in the range of approximately 40 to 250 μm. Accordingly, even when the number of layers of the laminated piezoelectric element is increased in order to obtain a larger dislocation by voltage application, reduction in size and reduction in height of a laminated piezoelectric actuator can be achieved, and in addition, the insulation breakdown of the piezoelectric layer 11 can be reduced. The thickness of the internal electrode layer 13 is preferably in the range of approximately 1 to 3 μm.

In the region 11a in the vicinity of the end portion, metal grains having a grain diameter in the range of 1 nm to 1 μm are preferably dispersed as the one or more metal phases. When the grain diameter is 1 nm or more, the electric field strength can be effectively decreased in the region 11a in the vicinity of the end portion. On the other hand, when the grain diameter is 1 μm or less, the withstand voltage can be suppressed from being decreased. In addition, since the metal grains are dispersed, the electric field is dispersed to the individual metal grains, so that electrical charge strength can be effectively decreased.

In a region in which the one or more metal phases are contained, an element forming the one or more metal phases preferably forms compound phases with a non-metal so that the one or more metal phases and the compound phases containing the non-metal are both contained. In particular, the one or more metal phases and oxide phases are preferably contained. When the total of the content of the one or more metal phases and that of the compound phases is assumed to be 100%, the content of the one or more metal phases in the region 11a in the vicinity of the end portion is preferably in the range of approximately 20 to 80 mass % and more preferably in the range of approximately 50 to 70 mass %. On the other hand, the content of the oxide of the metal element in the region 11a in the vicinity of the end portion is preferably smaller than that of the one or more metal phases and may be a value close to approximately 0. For example, when the metal element is silver, it is particularly preferable that the content of silver be higher than the content of silver oxide and that silver and silver oxide coexist. When silver and silver oxide are allowed to coexist in the region 11a in the vicinity of the end portion as described above, even if the piezoelectric layer 11 loses its electrical balance when the piezoelectric layer 11 is driven, silver and silver oxide are reversibly transformed, so that charge compensation can be performed. Accordingly, the characteristics of the piezoelectric layer 11 are stabilized. The ratio (existence ratio) of the content of the one or more metal phases to that of the oxide phases of the metal element can be measured when the peak intensity ratio obtained from spectral results of peaks measured by an x-ray photoelectron spectroscopy is assumed as the existence ratio.

In addition, when the metal element is silver, palladium is also preferably present in the region 11a in the vicinity of the end portion. When even a small amount of palladium is present, migration resistance of silver is improved.

In the region 11b of the piezoelectric layer 11 other than the region 11a in the vicinity of the end portion, the content of the oxide of the metal element is preferably higher than that of the one or more metal phases. The reason for this is that since the region 11b other than the region 11a in the vicinity of the end portion has strong influence on the displacement characteristics of the element, it is preferable that the electric field strength be not decreased in this region 11b. In addition, in this embodiment, the "region other than the region 11a in the vicinity of the end portion" indicates a region in which internal electrode layers 13 at the negative electrode and internal electrode layers 13 at the positive electrode face each other in the lamination direction as shown in FIG. 2 (region shown by a long- and double short-dashed line of FIG. 2). When measurement is performed using an x-ray photoelectron spectroscopy, as a representative position of the region shown by the long- and double short-dashed line, the vicinity of a front end portion of a leading line for the symbol 11b of FIG. 2, that is, the vicinity of a central portion of the region in a direction perpendicular to the lamination direction thereof, may be used.

When the above embodiment is considered from a different point of view, the configuration is as follows. That is, in a laminated piezoelectric element according to a second embodiment, the content of the one or more metal phases 21 comprising the metal element as a main component in the region 11a of the piezoelectric layer 11 in the vicinity of the end portion 13a of the internal electrode layer 13 is higher than the content of the one or more metal phases 21 comprising the metal element as a main component in the region 11b other than the region 11a in the vicinity of the end portion. In addition, in a laminated piezoelectric element according to a third embodiment, in the region 11a of the piezoelectric layer 11 in the vicinity of the end portion 13a of the internal electrode layer 13, the number of bonds between the metal elements is larger than the number of bonds between the metal element and oxygen. For analysis of the bonds between the metal elements and the bonds between the metal element and oxygen, for example, the piezoelectric layer 11 may be analyzed by an x-ray photoelectron spectroscopy.

When the piezoelectric layer 11 is analyzed by an x-ray photoelectron spectroscopy, the intensity of a peak indicating the bond between the metal elements is represented by E1, and the intensity of a peak indicating the bond between the metal element and oxygen is represented by E2. In this case, in the region 11a of the piezoelectric layer 11 in the vicinity of the end portion of the internal electrode layer 13, E1 is higher than E2. In addition, in the region 11b of the piezoelectric layer 11 other than the region 11a in the vicinity of the end portion, E2 is preferably higher than E1. When the metal element is silver, E1 is the intensity of a peak at 368.1 eV, and E2 is the intensity of a peak at 367.8 eV. On the other hand, in the region 11b of the piezoelectric layer 11 other than the region 11a in the vicinity of the end portion, the number of bonds between the metal element and oxygen is preferably larger than the number of bonds between the metal elements.

Figure 4:
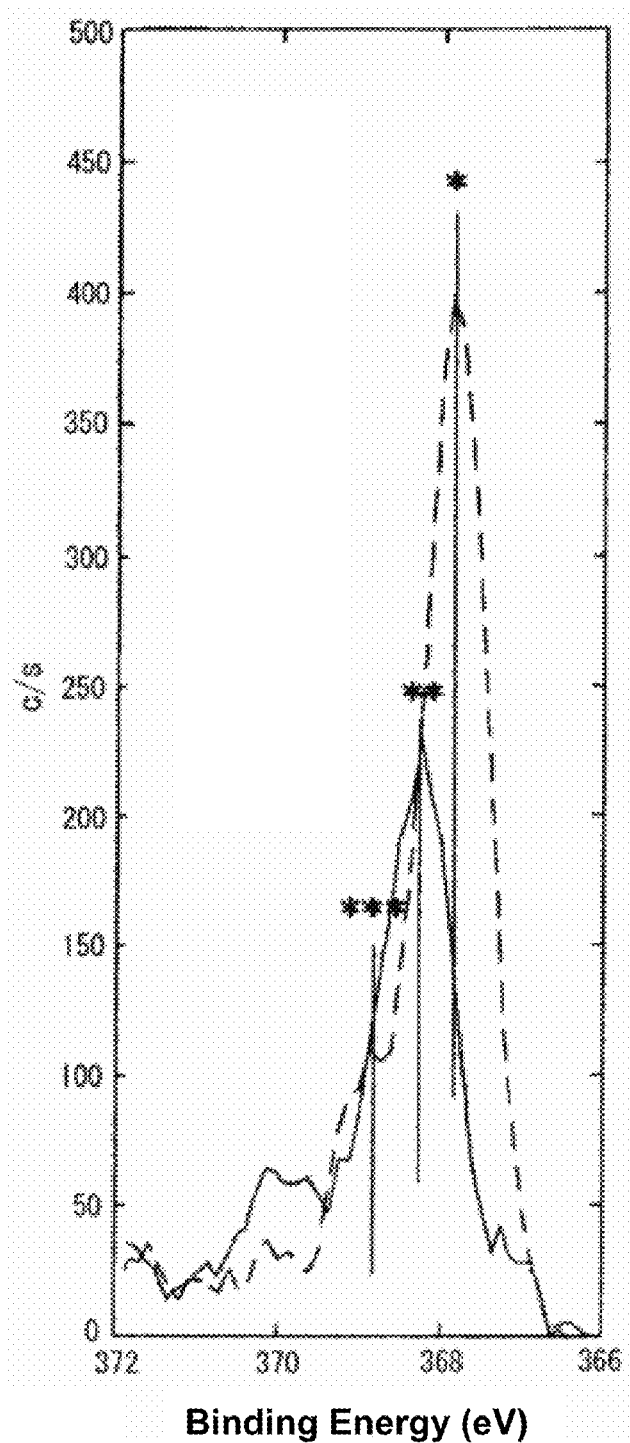
FIG. 4 is a graph showing measurement results obtained when a region in the vicinity of an end portion of the element shown in FIGS. 2 and 3 and a region other than the region in the vicinity of the end portion are analyzed by an x-ray photoelectron spectroscopy.

FIG. 4 is a graph showing the measurement results obtained when the region 11a in the vicinity of the end portion and the region 11b other than the region 11a in the vicinity of the end portion of the element shown in FIG. 3 are analyzed by an x-ray photoelectron spectroscopy. In FIG. 4, a solid line shows the analytical result of the region 11a in the vicinity of the end portion, and a broken line shows the analytical result of the region 11b other than the region 11a in the vicinity of the end portion. As shown in FIG. 4, in the region 11a in the vicinity of the end portion, the peak (E1) is observed at 368.1 eV, and the peak (E2) is hardly observed at 367.8 eV. From this measurement result, in the region 11a in the vicinity of the end portion, it is understood that the number of bonds between the silver elements is larger than the number of bonds between the silver element and oxygen (E1>E2). On the other hand, in the region 11b other than the region 11a in the vicinity of the end portion, the peak (E2) is observed at 367.8 eV, and the peak (E1) is hardly observed at 368.1 eV. From this measurement result, in the region 11b other than the region 11a in the vicinity of the end portion, it is understood that the number of bonds between the silver element and oxygen is larger than the number of bonds between the silver elements (E2>E1).

In the graph shown in FIG. 4, as the measurement point of the region 11b other than the region 11a in the vicinity of the end portion, the vicinity of the front end of the leading line for the symbol 11b in FIG. 2, that is, the vicinity of the central portion in a direction perpendicular to the lamination direction thereof, is used.

In addition, the measurement conditions of an x-ray photoelectron spectroscopy shown in FIG. 4 are as follows.
<Measurement Conditions>
X-ray photoelectron spectroscopic analyzer: manufactured by PHI,
Model No.: QUANTUM 2000
Pre-treatment: surface contaminated layer is removed by Ar ion etching.
PassEnergy: 58.70 eV
StepSize: 0.125 eV
In the laminated piezoelectric element according to this embodiment, at least the region 11a in the vicinity of the end portion of the internal electrode layer 13 at the negative electrode is preferably in the state described above. Accordingly, since being dispersed in the region 11a in the vicinity of the end portion of the internal electrode layer 13, the metal grains trap oxygen holes which may be generated in some cases when the element is driven and prevent the oxygen holes from reaching the internal electrode layer (low potential side electrode) at the negative electrode, so that degradation in insulating characteristics can be suppressed.

In the laminated piezoelectric element according to the third embodiment, in the region 11a of the piezoelectric layer 11 in the vicinity of the end portion of the internal electrode layer 13, the content of the one or more metal phases comprising the metal element as a main component is higher than the content of the one or more metal phases comprising the metal element as a main component in the region 11b other than the region 11a in the vicinity of the end portion. As described above, the content of the one or more metal phases in the region 11a in the vicinity of the end portion is preferably in the range of approximately 20 to 80 mass % and more preferably in the range of approximately 50 to 70 mass %. On the other hand, the content of the one or more metal phases in the region 11b other than the region 11a in the vicinity of the end portion is preferably in the range of approximately 0 to 80 mass %. Approximately 30 to 50 mass % is a sufficient effect to decrease the electric field strength in the region 11a of the piezoelectric layer 11 in the vicinity of the end portion can be sufficiently ensured.

The content of the one or more metal phases in the region 11a of the piezoelectric layer 11 in the vicinity of the end portion of the internal electrode layer 13 and the content of the one or more metal phases in the region 11b other than the region 11a in the vicinity of the end portion can be measured, for example, by the above-described x-ray photoelectron spectroscopy.

<Manufacturing Method>

Next, a method for manufacturing the above-described laminated piezoelectric element according to this embodiment will be described. First, for example, lead zirconate titanate (PZT) powder, a binder composed of an organic polymer such as an acrylic or a butyral polymer, a plasticizer such as DBP (dibutyl phthalate) or DOP (dioctyl phthalate), and a compound powder (such as silver oxide powder) of a metal element and a non-metal element are mixed together to form a slurry. Subsequently, ceramic green sheets are formed from this slurry using a known tape molding method, such as a doctor blade method or calendar roll method. The addition amount of an oxide powder of the metal element is preferably in the range of approximately 0.03 to 0.15 mass %.

Next, a metal paste for the internal electrode layer 13 is formed. This metal paste is formed by adding a binder, a plasticizer, and the like to a metal powder primarily composed of silver-palladium, followed by mixing. This metal paste is printed on one surface of each ceramic green sheet by screen printing or the like, so that paste layers for the internal electrode layers are formed.

Next, the green sheets on which the metal paste is printed are laminated to have a structure as shown in FIG. 2, for example, and are then dried, so that a laminate molded body before firing is obtained. In this step, when it is necessary to further increase the thickness of the ceramic layer, green sheets on which no metal paste is printed may be locally laminated at a place at which the thickness must be increased. In addition, the laminate molded body can be cut to form a desired shape. When screen printing is used, the metal paste layer may be formed to have a thickness in the range of approximately 1 to 40 μm.

Subsequently, after dewaxed at a predetermined temperature, the laminate molded body is fired at 900 to 1,150° C. Next, after a sintered body is processed to have a desired dimension, the external electrodes 17 are formed. After a binder, a plasticizer, a glass powder, and the like are added to a metal powder primarily composed of silver and are then mixed together to form a metal paste, this metal paste is printed on side surfaces of the sintered body by screen printing or the like and is fired at 600 to 800° C., so that the external electrodes 17 are formed.

Furthermore, conductive auxiliary members each composed of a conductive adhesive in which a metal mesh or a mesh-shaped metal plate is buried may be formed on the external surfaces of the external electrodes 17. The metal mesh indicates woven metal wires, and the mesh-shaped metal plate indicates a metal plate in which holes are formed to have a mesh shape.

Subsequently, after lead wires are connected to the external electrodes 17 with solder or the like, a packaging resin composed of a silicon rubber or the like is coated on side surfaces of a laminate structure including the external electrodes 17 by a method such as dipping, so that the laminated piezoelectric element of the present invention is obtained.

In the laminated piezoelectric element thus obtained, a part of metals, such as silver and palladium which are contained in the metal pastes may be slightly diffused into the piezoelectric layer 11 during firing; however, in general, a metal present in the piezoelectric layer 11 is oxidized by heat in firing and is present in the form of an oxide, such as silver oxide. In order to obtain a higher effect of the present invention, as described above, an oxide powder (such as silver oxide powder) of a metal element is preferably added to a slurry for the ceramic green sheets.

Next, an electrical power is supplied to the laminated piezoelectric element thus obtained in a reducing atmosphere or a vacuum atmosphere. Accordingly, the region 11a in the vicinity of the end portion on which an electric field is likely to be concentrated can be locally heated. As a result, in the region 11a in the vicinity of the end portion, since silver oxide present in the region 11a in the vicinity of the end portion is selectively reduced, the number of bonds between silver elements becomes larger than the number of bonds between a silver element and oxygen. That is, in the region 11a in the vicinity of the end portion, the content of silver is higher than the content of silver oxide. On the other hand, unlike on the region 11a in the vicinity of the end portion, an electric field is not likely to be concentrated on the region 11b other than the region 11a in the vicinity of the end portion, and hence the temperature is not so much increased as compared to that in the region 11a in the vicinity of the end portion when an electrical power is supplied. Hence, in the region 11b other than the region 11a in the vicinity of the end portion, the number of bonds between a silver element and oxygen is still larger than the number of bonds between silver elements (bonds between metal elements). That is, the content of silver oxide is higher than the content of silver.

As described above, when the silver oxide present in the region 11a is selectively reduced by locally heating the vicinity of the end portion using the electric field concentration, the temperature closer to the end portion 13a of the internal electrode layer 13 at which an electric field is highly concentrated can be higher, and the one or more metal phases 21 can be distributed at a higher density at a position closer to the end portion 13a of the internal electrode layer 13.

When an electrical power is supplied in a reducing atmosphere or a vacuum atmosphere to the laminated piezoelectric element, the oxide, such as silver oxide, can be reduced by locally heating the region 11a in the vicinity of the end portion, and the reasons for this are as follows.

When the laminated piezoelectric element is simply disposed in a reducing atmosphere or a vacuum atmosphere, the piezoelectric layer 11 is acceleratedly reduced as the ambient temperature is increased; however, in this case, since the laminated piezoelectric element is sequentially reduced from the surface to the inside thereof, the oxide, such as silver oxide, present in the piezoelectric layer 11 is not only reduced, but also piezoelectric grains present in the surface of the element directly exposed to a reducing atmosphere or a vacuum atmosphere are reduced.

However, when an electrical power is supplied to the laminated piezoelectric element in a reducing atmosphere or a vacuum atmosphere, the laminated piezoelectric element is self-heated by electrical power supply, and since a region in which self-heating particularly occurs is the region 11a in the vicinity of the end portion at which an electric field is likely to be concentrated, the region 11a in the vicinity of the end portion is locally heated, so that the oxide, such as silver oxide, present in the region 11a in the vicinity of the end portion can be selectively reduced.

In the case in which an electrical power is supplied to the laminated piezoelectric element placed in an atmosphere isolated from the outside air, for example, in a solution, such as an oil, the atmosphere is not an oxidizing atmosphere but is also a slightly reducing atmosphere; however, in this case, since the heat capacity of the solution, such as an oil, is larger than that of the laminated piezoelectric element, even when the laminated piezoelectric element is self-heated during electrical power supply, the heat of the laminated piezoelectric element is taken by the solution such as an oil having a larger heat capacity, so that the region 11a in the vicinity of the end portion at which an electric field is likely to be concentrated cannot be locally heated. Hence, the region 11a in the vicinity of the end portion cannot be selectively reduced, and the entire surface of the piezoelectric layer 11 in contact with the internal electrode layer 13 is reduced under the same conditions, so that the oxide, such as silver oxide, present in the region 11a in the vicinity of the end portion cannot be selectively reduced.

In order to reduce the oxide, such as silver oxide, present in the region 11a in the vicinity of the end portion, the effect can be obtained when the laminated piezoelectric element processed by the polarization treatment is continuously driven in a reducing atmosphere or a vacuum atmosphere, the effect is further enhanced.

As preferable conditions for the electrical power supply, for example, while evacuation is performed by a rotary pump, polarization may be performed for 30 minutes by repeatedly applying a direct voltage of 200 V for one second at one second intervals. Furthermore, when the repeating rate between the power supply and the interval is increased, since silver oxide (oxide of a metal element) present in the region 11a in the vicinity of the end portion can be reduced in a shorter period of time, polarization is preferably performed by applying a rectangular wave of 0 to 200 V at a frequency of 100 Hz using a pulse generator.

In addition, the pressure in the evacuation is preferably 10 Torr (approximately 1.33 kPa) or less, and in order to reduce silver oxide (compound between a metal element and a nonmetal element) present in the region in the vicinity of the end portion in a shorter period of time by further decreasing an oxygen partial pressure around the element, the pressure is preferably set to 1 Torr (approximately $1.33 \times 10^2$ Pa) or less using a turbo molecular pump.

In order to reduce silver oxide (oxide of a metal element) present in the region 11a in the vicinity of the end portion in a short period of time while an electrical power is supplied, since the laminated piezoelectric element must be driven by electrical power supply, the temperature of the laminated piezoelectric element is preferably equivalent to or less than a Curie temperature of a material forming a piezoelectric body 11 so that the degree of drive deformation thereof is increased. In particular, the laminated piezoelectric element is preferably evacuated while being heated to 200° C. so as not to generate temperature distribution therein due to a local increase in temperature.

In addition, when being entirely heated, the piezoelectric body is entirely reduced, and the characteristics of the element are degraded; hence, it is not preferable. In this embodiment, since an electrical power is supplied in a reducing atmosphere or a vacuum atmosphere, the whole piezoelectric body is not reduced, and the region in the vicinity of the end portion is locally heated, so that the metal element contained in the region in the vicinity of the end portion can be selectively reduced.

The piezoelectric body is formed, for example, of a piezoelectric ceramic material containing lead zirconate titanate $Pb(Zr,Ti)O_3$ (hereinafter referred to as "PZT") or barium titanate $BaTiO_3$ as a main component. This piezoelectric ceramic preferably has a high piezoelectric strain constant $d_{33}$ which indicates its piezoelectric characteristics. As the metal powder for the internal electrode layer, besides silver-palladium powder, powders of copper, palladium, platinum, nickel, or the like may also be used. In particular, in order to selectively reduce a metal element contained in the region 11a in the vicinity of the end portion by locally heating the region 11a in the vicinity of the end portion, silver is preferably used since it is most easily reduced.

<Ejection Device>

Figure 5:
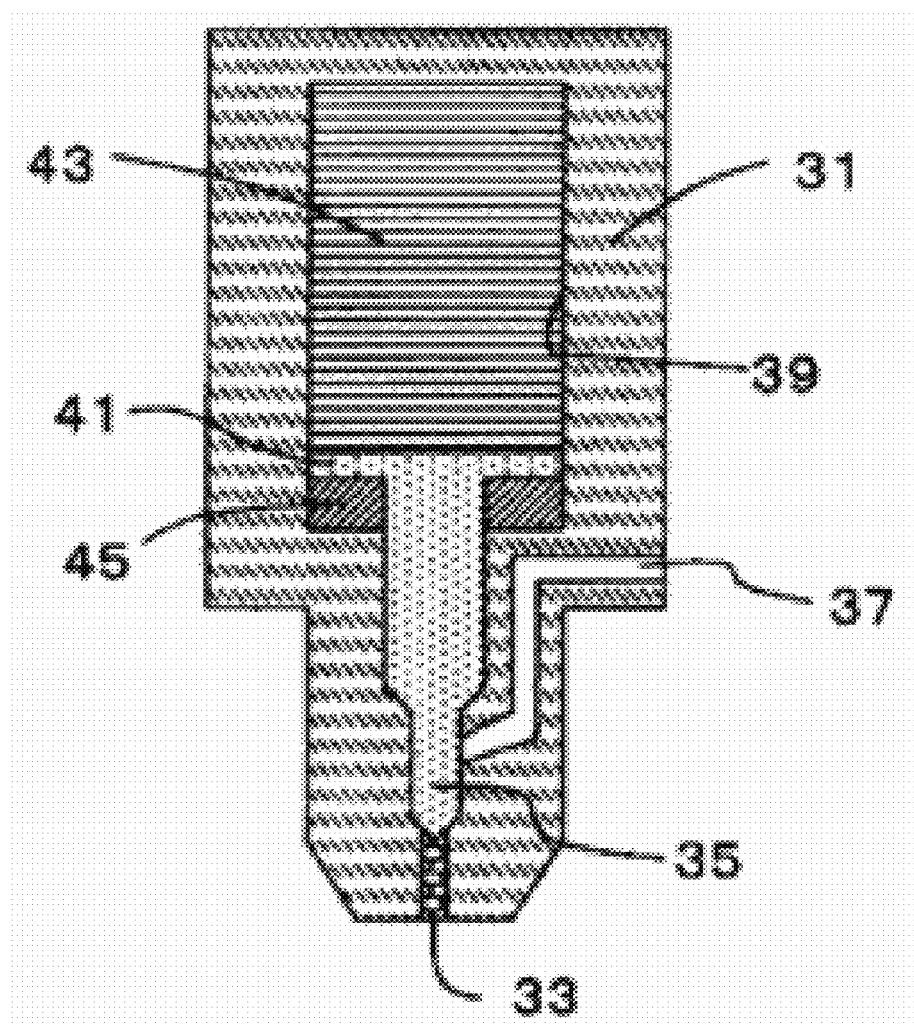
FIG. 5 is a cross-sectional view illustrating an ejection device according to an embodiment of the present invention.

FIG. 5 is a schematic cross-sectional view illustrating an ejection device according to an embodiment. As shown in FIG. 5, in an ejection device 53 according to this embodiment, a laminated piezoelectric element represented by the above embodiment is accommodated in a container 31 which includes an ejection hole 33 at one end thereof. Inside the container 31, a needle valve 35 which can open and shut the ejection hole 33 is disposed. A fuel path 37 is provided so as to be able to communicate with the ejection hole 33 in accordance with the movement of the needle valve 35. This fuel path 37 is connected to an external fuel supply source, and a fuel is always supplied to the fuel path 37 at a predetermined high pressure. Hence, when the needle valve 35 opens the ejection hole 33, a fuel supplied to the fuel path 37 is configured to be ejected at a predetermined high pressure into a fuel chamber of an internal combustion engine not shown.

In addition, an upper end portion of the needle valve 35 has a larger inside diameter, and a piston 41 slidable with a cylinder 39 formed inside the container 31 is disposed. In addition, in the container 31, a piezoelectric actuator comprising the above-described laminated piezoelectric element 43 is accommodated.

In the ejection device described above, when the piezoelectric actuator is expanded by voltage application, the piston 41 is pushed down, and the needle valve 35 closes the ejection hole 33, so that the supply of fuel is stopped. In addition, when the voltage application is stopped, the piezoelectric actuator is contracted, and the piston 41 is pushed back by a disc spring 45, so that the fuel is ejected since the ejection hole 33 communicates with the fuel path 37.

In addition, the ejection device 53 of the present invention may comprise a container having the ejection hole 33 and the laminated piezoelectric element 43 described above and may be configured such that a liquid filled in the container is ejected through the ejection hole 33 by drive of the laminated piezoelectric element 43. That is, the element 43 is not always necessarily placed in the container and may be configured such that a pressure is applied to the inside of the container by the drive of the laminated piezoelectric element. In addition, according to the present invention, the liquid includes various liquid fluids (conductive paste and the like) as well as fuel, ink, and the like.

<Fuel Ejection System>

Figure 6:
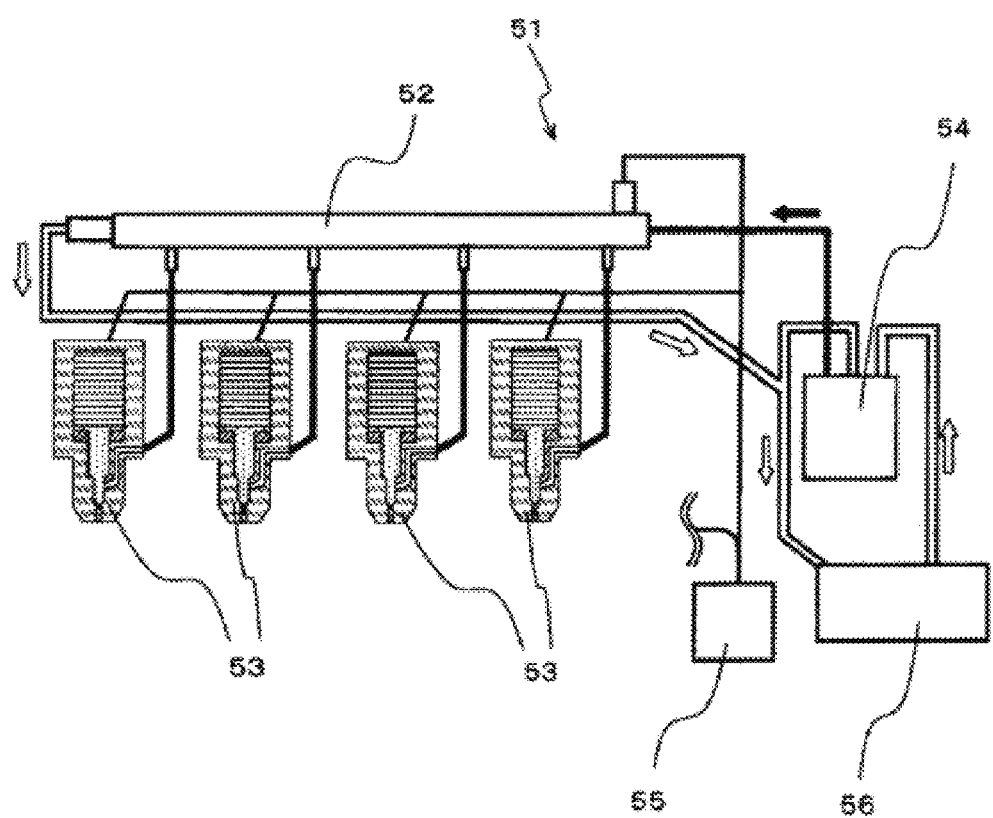
FIG. 6 is a schematic view illustrating a fuel ejection system according to an embodiment of the present invention.

FIG. 6 is a schematic view illustrating a fuel ejection system according to an embodiment. As shown in FIG. 6, a fuel ejection system 51 according to the present embodiment comprises a common rail 52 storing a high-pressure fuel, a plurality of the ejection devices 53 described above each eject a fuel stored in the common rail 52, a pressure pump 54 supplying a high-pressure fuel to the common rail 52, and an ejection control unit 55 supplying drive signals to the ejection devices 53.

The ejection control unit 55 is a unit to control the amount of ejection fuel and the timing thereof while conditions of combustion chambers of an engine are monitored by sensors and the like. The pressure pump 54 functions to supply a fuel from a fuel tank 56 to the common rail 52 at a pressure of approximately 1,000 to 2,000 atmospheres (approximately 101.3 MPa to 202.7 MPa) and more preferably at a pressure of approximately 1,500 to 1,700 atmospheres (approximately 152 MPa to 172.3 MPa). The common rail 52 stores a fuel supplied from the pressure pump 54 and then appropriately feeds the fuel to the ejection devices 53. Each ejection device 53 ejects a small amount of fuel in the form of mist into the combustion chamber through the ejection hole 33 as described above.

EXAMPLES

A piezoelectric actuator comprising the laminated piezoelectric element according to this embodiment was manufactured as described below.

<Sample No. 1>

First, slurry was prepared by mixing a calcined piezoelectric ceramic powder containing lead zirconate titanate ($PbZrO_3$—$PbTiO_3$) having an average grain diameter of 0.4 μm as a main component, a binder, and a plasticizer. Ceramic green sheets for piezoelectric layers having a thickness of approximately 150 μm after firing were formed from this slurry by a doctor blade method. Next, a conductive paste for the internal electrode layer 13 was prepared by adding a binder to a silver-palladium alloy (95 percent by mass of silver-5 percent by mass of palladium). This conductive paste was printed on a surfaces of the ceramic green sheets by a screen printing method, and 300 green sheets thus processed were then laminated to each other. This laminate green body was maintained at 800° C. for 90 minutes and was then fired at 1,000° C. for 200 minutes. The obtained sintered body was processed to have a predetermined dimension.

<Sample No. 2>

A laminated green body was obtained in a manner similar to that of Sample No. 1 except that slurry prepared by mixing a calcined piezoelectric ceramic powder containing lead zirconate titanate ($PbZrO_3$—$PbTiO_3$) having an average grain diameter of 0.4 μm as a main component, a binder, $Ag_2O$, and a plasticizer was used. The laminate green body was fired under firing conditions similar to those of Sample No. 1 and was then processed to have a predetermined dimension. The content of $Ag_2O$ in the slurry was set to 0.09 percent by mass.

<Sample No. 3>

As green sheets of Sample No. 3, the following green sheets 1 to 4 were prepared.

Green sheets 1 (sheets containing $Ag_2O$ dispersed therein): sheets having a thickness of 75 μm formed by using the same slurry as that of Sample No. 2.

Green sheets 2 (sheets containing no $Ag_2O$): sheets formed by printing the same conductive paste as that of Sample No. 1 by a screen printing method on upper surfaces of sheets having a thickness of 75 μm formed by using the same slurry as that of Sample No. 1.

Green sheets 3 (sheets containing no $Ag_2O$): sheets having a thickness of 75 μm formed by using the same slurry as that of Sample No. 1.

Green sheets 4 (sheets containing $Ag_2O$ dispersed therein): sheets formed by printing the same conductive paste as that of Sample No. 1 by a screen printing method on upper surfaces of sheets having a thickness of 75 μm formed by using the same slurry as that of Sample No. 2.

Then, the green sheets 1 to 4 are laminated to each other in this order so as to form a laminate green body in which the number of the internal electrode layers 13 was 300. In the laminate green body, a conductive paste layer forming the internal electrode layer 13 at a negative electrode side was sandwiched between the green sheets 1 and 4 each containing $Ag_2O$ dispersed therein, and a conductive paste layer forming the internal electrode layer 13 at a positive electrode side was sandwiched between the green sheets 2 and 3 each containing no $Ag_2O$. This laminate green body was fired in a manner similar to that of Sample No. 1. The obtained sintered body was processed to have a predetermined dimension.

Next, 8 parts by mass of a binder was added to 100 parts by mass of a mixture containing a flaky silver powder having an average particle diameter of 2 μm and an amorphous glass powder (softening point: 640° C.) primarily composed of silicon having an average particle diameter of 2 μm and was then sufficiently mixed together, so that a silver-glass conductive paste was formed. After this silver-glass conductive paste was printed on mold-releasing films by screen printing and was then dried, the mold-releasing films were peeled away, so that sheets of the silver-glass conductive paste were obtained.

Next, after the above sheets of the silver-glass conductive paste were laminated one after another by transfer on side surfaces (external-electrode forming surfaces) of the sintered body of each of Sample Nos. 1 to 3, firing was performed at 700° C. for 30 minutes, so that the external electrodes 17 (negative external electrode 17a and positive external electrode 17b) of each Sample No. were formed.

Subsequently, after lead wires were connected to the external electrodes 17 with solder, a packaging resin composed of a silicone rubber or the like was coated on side surfaces of a laminate structure including the external electrodes 17 by using a dipping method.

<Polarization Step of Sample No. 1>

A rectangular wave of 0 to 200 V was applied at a frequency of 100 Hz for 30 minutes to the positive external electrode 17b and the negative external electrode 17a through the lead wires, so that a laminated piezoelectric element was obtained. This polarization treatment was performed in the air at a normal pressure.

<Polarization Step of Sample No. 2>

An evacuation treatment was performed in a vacuum oven at 200° C., and a polarization treatment was performed by applying a rectangular wave of 0 to 200 V at a frequency of 100 Hz for 30 minutes to the positive external electrode 17b and the negative external electrode 17a through the lead wires, so that a laminated piezoelectric element was obtained. In addition, the pressure in the evacuation was set to 3 Torr.

<Polarization Step of Sample No. 3>

A polarization treatment was performed in a manner similar to that of Sample No. 2, so that a laminated piezoelectric element was obtained. In addition, in Sample No. 3, it was configured that a positive electrode voltage was applied to the internal electrode layers 13 each located between the green sheets 2 and 3.

<Evaluation Method>

When a direct voltage of 170 V was applied to each laminated piezoelectric element thus obtained, in all the elements (piezoelectric actuators), a dislocation was obtained in the lamination direction. A test was performed on each element in which an alternating voltage of 0 to +170 V at a frequency of 150 Hz was applied so that a continuous drive was performed $1 \times 10^9$ times. The results are shown in Table 1.

TABLE 1

| Sample No. | Dispersion of metal grains in region in vicinity of end portion | Initial displacement amount (μm) | Displacement amount after $1.0 \times 10^9$ cycles |
|---|---|---|---|
| 1 | No presence | 35 | Stop at $2.3 \times 10^8$ cycles |
| 2 | Yes, present in vicinity of end portion of internal electrode layer at each side of positive and negative electrodes | 33 | 30 |
| 3 | Yes, present in vicinity of end portion of internal electrode layer at negative electrode side | 34 | 34 |

<Evaluation Results>

A metal present in the piezoelectric layer 11 of each laminated piezoelectric element was evaluated using an EPMA method and an XPS method.

In general, by thermal oxidation in firing, a metal oxide, such as silver oxide, is present in the form of oxide immediately after the firing, and even by a subsequent polarization treatment, in the piezoelectric layer 11 of Sample No. 1, silver was simply dispersed in the form of silver oxide, so that the presence of a reduced metal phase was not observed.

In the piezoelectric layer 11 of Sample No. 2, the presence of reduced silver was confirmed in the region 11a in the vicinity of the end portion of each internal electrode layer 13.

By an XPS method, Ag in the form of a metal phase was confirmed in the region 11a in the vicinity of the end portion. In the region 11b other than the region 11a in the vicinity of the end portion, Ag in the form of a metal phase was not detected.

In addition, in the region 11a in the vicinity of the end portion, the peak of Ag in the form of a metal phase was larger than the peak of Ag in the form of an oxide phase, and it was detected that most of silver was in the form of a metal phase.

In the piezoelectric layer 11 of Sample No. 3, the presence of reduced silver could be confirmed only in the region 11a in the vicinity of the end portion of the internal electrode layer 13 at the negative electrode side.

By an XPS method, silver in the form of a metal phase was confirmed in the region 11a in the vicinity of the end portion. In the region 11b other than the region 11a in the vicinity of the end portion, silver in the form of a metal phase was not detected.

In addition, in the region 11a in the vicinity of the end portion, the peak of silver in the form of an oxide phase was not observed, the peak of silver in the form of a metal phase was observed, and it was detected that most of silver was primarily in the form of a metal phase.

In addition, as shown in Table 1, in Sample No. 1, before predetermined $1 \times 10^9$ cycles were performed in the continuous drive test, the displacement amount was decreased at $3 \times 10^7$ cycles.

On the other hand, Sample No. 3 had durability to withstand the continuous drive test of predetermined $1 \times 10^9$ cycles. That is, considerable degradation from the initial displacement amount was not observed, an effective displacement amount necessary as a laminated piezoelectric element was ensured, and the durability was superior. Among those mentioned above, according to Sample No. 3, the effective displacement amount was ensured from the initial stage, and the element performance was not changed even after the continuous drive; hence, the element displacement amount was stable, and significant durability was ensured.

The invention claimed is:

1. A laminated piezoelectric element comprising:
   a plurality of piezoelectric layers; and
   a plurality of internal electrode layers wherein the piezoelectric layers and the internal electrode layers are alternately laminated to each other, and
   wherein the piezoelectric layers comprise:
      first regions in the vicinities of end portions of the internal electrode layers, each comprising one or more metal phases; and
      a second region in the piezoelectric layers excluding the first regions, comprising the one or more metal phases less than the first regions.

2. The laminated piezoelectric element according to claim 1, wherein each of the first regions comprises the one or more metal phases more than an oxide phase comprising an oxide of a the same metal element in the one or more metal phases.

3. The laminated piezoelectric element according to claim 2, wherein the second region comprises the oxide phase more than the metal phase.

4. The laminated piezoelectric element according to claim 1, wherein the piezoelectric layers comprise:
   piezoelectric ceramic grains, and
   the metal phase in grain boundaries of the piezoelectric ceramic grains.

5. The laminated piezoelectric element according to claim 1, wherein the metal phase is in the first regions.

6. The laminated piezoelectric according to claim 5, wherein the metal phase dispersed in the first regions comprises metal grains having a grain diameter in the range of 1 nm to 1 μm.

7. The laminated piezoelectric element according to claim 6, wherein the metal grains comprise at least one of silver, copper, palladium, platinum, and nickel.

8. The laminated piezoelectric element according to 1 claim 2, wherein in the first regions, the metal phase comprises silver and an oxide phase comprises silver oxide.

9. A laminated piezoelectric element comprising:
   a plurality of piezoelectric layers comprising first regions in the vicinities of end portions of the internal electrode layers, each of the first regions comprising metal elements and oxygen elements wherein the number of bonds between the metal elements is larger than the number of bonds between the metal element and the oxygen element; and
   a plurality of internal electrode layers wherein the piezoelectric layers and the internal electrode layers are alternately laminated to each other.

10. The laminated piezoelectric element according to claim 9, wherein the plurality of piezoelectric layers further comprise a second region in the piezoelectric layers excluding the first regions, the second region comprising the number of bonds between the metal element and oxygen larger than the number of bonds between the metal elements.

11. A laminated piezoelectric element comprising:
a plurality of piezoelectric layers comprising first regions in the vicinities of end portions of the internal electrode layers, each of the first regions comprising a metal; and
a plurality of internal electrode layers wherein the piezoelectric layers and the internal electrode layers are alternately laminated to each other,
wherein in the first region, E1 is higher than E2 where E1 represents a peak intensity of an x-ray photoelectron spectroscopy indicating a bond between the metal elements and E2 represents a peak intensity of an x-ray photoelectron spectroscopy indicating a bond between the metal element and a non-metal element.

12. The laminated piezoelectric element according to claim 11, wherein the plurality of piezoelectric layers further comprise a second region in the piezoelectric layers excluding the first regions, the second region and wherein E2 is higher than E1 in the second region.

13. A fluid ejector, comprising:
a fluid path configured to comprise a fluid therein;
a valve operable to open or close the fluid path; and
the laminated piezoelectric element according to claim 1, operable to make the valve open or close the fluid path.

14. A fluid ejection system, comprising:
the fluid ejector according to claim 13;
a common rail connected to the fluid pass and configured to store the fluid therein;
a pressure pump operable to supply the fluid from the common rail to the fluid path; and
an ejection control unit operable to send a signal for opening the valve to the fluid ejector.

15. A fluid ejector, comprising:
a fluid path configured to comprise a fluid therein;
a valve operable to open or close the fluid path; and
the laminated piezoelectric element according to claim 9, operable to make the valve open or close the fluid path for ejecting the fluid.

16. A fluid ejection system, comprising:
the fluid ejector according to claim 15;
a common rail, connected to the fluid pass and configured to store the fluid therein;
a pressure pump operable to supply the fluid from the common rail to the fluid path; and
an ejection control unit operable to send a signal for opening the valve to the fluid ejector.

17. A fluid ejector, comprising:
a fluid path configured to comprise a fluid therein;
a valve operable to open or close the fluid path; and
the laminated piezoelectric element according to one of claim 11, operable to make the valve open or close the fluid path for ejecting the fluid.

18. A fluid ejection system, comprising:
the fluid ejector according to claim 17;
a fluid container connected to the fluid pass and configured to store the fluid therein;
a pressure pump operable to supply the fluid from the common rail to the fluid path; and
an ejection control unit operable to send a signal for opening the valve to the fluid ejector.

* * * * *